(12) United States Patent
Webb et al.

(10) Patent No.: US 9,831,306 B2
(45) Date of Patent: Nov. 28, 2017

(54) SELF-ALIGNED GATE EDGE AND LOCAL INTERCONNECT AND METHOD TO FABRICATE SAME

(71) Applicant: INTEL CORPORATION, Santa Clara, CA (US)

(72) Inventors: Milton Clair Webb, Aloha, OR (US); Mark Bohr, Aloha, OR (US); Tahir Ghani, Portland, OR (US); Szuya S. Liao, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/024,750

(22) PCT Filed: Dec. 19, 2013

(86) PCT No.: PCT/US2013/076673
§ 371 (c)(1),
(2) Date: Mar. 24, 2016

(87) PCT Pub. No.: WO2015/094305
PCT Pub. Date: Jun. 25, 2015

(65) Prior Publication Data
US 2016/0233298 A1    Aug. 11, 2016

(51) Int. Cl.
*H01L 29/06* (2006.01)
*H01L 29/66* (2006.01)
(Continued)

(52) U.S. Cl.
CPC .... *H01L 29/0649* (2013.01); *H01L 21/76895* (2013.01); *H01L 21/823821* (2013.01);
(Continued)

(58) Field of Classification Search
CPC ......... H01L 29/66628; H01L 29/66795; H01L 29/785; H01L 29/0649; H01L 29/66545;
(Continued)

(56) References Cited

U.S. PATENT DOCUMENTS 6,515,319 B2   2/2003   Widmann et al.
7,781,274 B2   8/2010   Nakabayashi et al.
(Continued)

FOREIGN PATENT DOCUMENTS

JP   2002-530872   9/2002
JP   2004-356472   12/2004
(Continued)

OTHER PUBLICATIONS

International Search Report and Written Opinion from PCT/US2013/07667 dated Sep. 26, 2014, 10 pages.
(Continued)

*Primary Examiner* — Roy Potter
(74) *Attorney, Agent, or Firm* — Schwabe, Williamson & Wyatt P.C.

(57) ABSTRACT

Self-aligned gate edge and local interconnect structures and methods of fabricating self-aligned gate edge and local interconnect structures are described. In an example, a semiconductor structure includes a semiconductor fin disposed above a substrate and having a length in a first direction. A gate structure is disposed over the semiconductor fin, the gate structure having a first end opposite a second end in a second direction, orthogonal to the first direction. A pair of gate edge isolation structures is centered with the semiconductor fin. A first of the pair of gate edge isolation structures is disposed directly adjacent to the first end of the gate structure, and a second of the pair of gate edge isolation structures is disposed directly adjacent to the second end of the gate structure.

45 Claims, 15 Drawing Sheets

(51) Int. Cl.
| | |
|---|---|
| *H01L 29/78* | (2006.01) |
| *H01L 21/768* | (2006.01) |
| *H01L 21/8238* | (2006.01) |
| *H01L 23/535* | (2006.01) |
| *H01L 27/092* | (2006.01) |
| *H01L 29/417* | (2006.01) |

(52) U.S. Cl.
CPC .... *H01L 21/823878* (2013.01); *H01L 23/535* (2013.01); *H01L 27/0924* (2013.01); *H01L 29/41791* (2013.01); *H01L 29/66545* (2013.01); *H01L 29/66795* (2013.01); *H01L 29/785* (2013.01)

(58) Field of Classification Search
CPC ............. H01L 29/41791; H01L 23/535; H01L 27/0924; H01L 21/823821; H01L 21/76895; H01L 21/823878
See application file for complete search history.

(56) References Cited

U.S. PATENT DOCUMENTS

| | | | |
|---|---|---|---|
| 2005/0056888 A1* | 3/2005 | Youn | ............... H01L 21/823437 257/331 |
| 2007/0054464 A1 | 3/2007 | Zhang | |
| 2007/0080380 A1 | 4/2007 | Chang | |
| 2008/0080380 A1 | 4/2008 | Lee et al. | |
| 2011/0021027 A1 | 1/2011 | Johnson | |
| 2011/0291188 A1 | 12/2011 | Cheng et al. | |
| 2013/0020615 A1 | 1/2013 | Fan et al. | |
| 2013/0134506 A1 | 5/2013 | Yagishita | |
| 2013/0214364 A1 | 8/2013 | Jagannathan et al. | |

FOREIGN PATENT DOCUMENTS

| | | |
|---|---|---|
| JP | 2009260221 | 11/2009 |
| KR | 20050082099 | 8/2005 |
| TW | 201017772 | 5/2010 |

OTHER PUBLICATIONS

International Preliminary Report on Patentability for PCT Application No. PCT/US2013/076673 dated Jun. 30, 2016, 7 pages.

Non-Final Office Action and Search Report for Taiwan Patent Application No. 103137443 dated Jun. 3, 2016, 3 pgs.

Notice of Reasons for Refusal from Japanese Patent Application No. 2016-526912 dated Jul 26, 2017, 10 pgs., English translation.

* cited by examiner

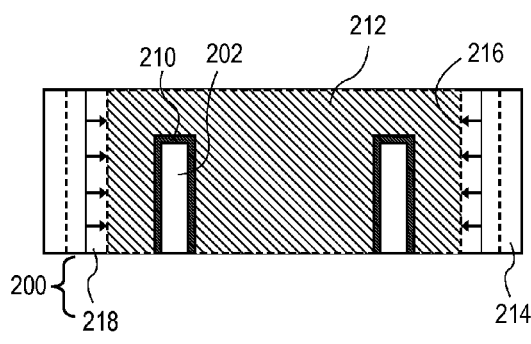
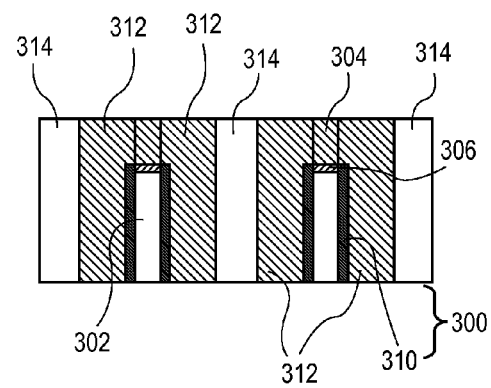
FIG. 2C   FIG. 3C
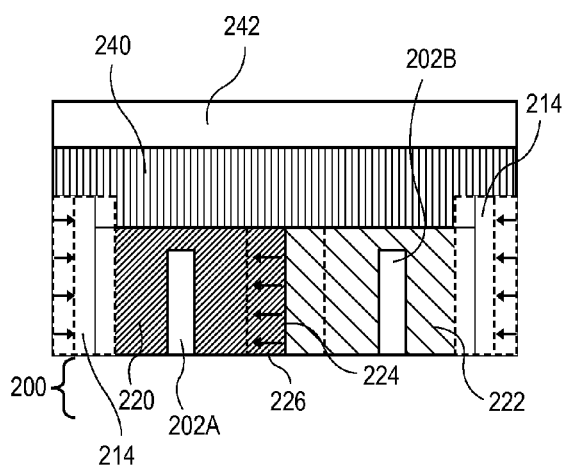
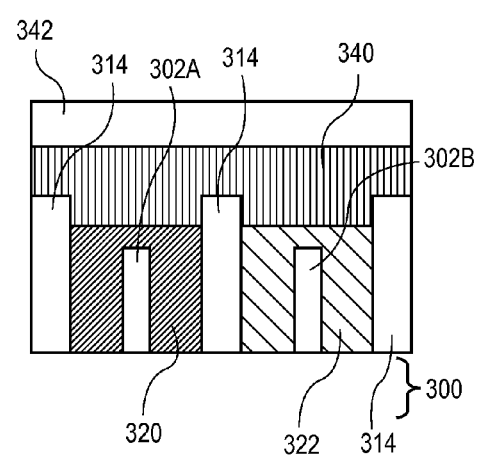
FIG. 2D   FIG. 3D

SELF-ALIGNED GATE EDGE AND LOCAL INTERCONNECT AND METHOD TO FABRICATE SAME

CLAIM OF PRIORITY

This application is a U.S. National Phase application under 35 U.S.C. §371 of International Application No. PCT/US13/076673, filed Dec. 19, 2013, entitled "SELF-ALIGNED GATE EDGE AND LOCAL INTERCONNECT AND METHOD TO FABRICATE SAME" the entire contents of which are incorporated herein by reference.

TECHNICAL FIELD

Embodiments of the invention are in the field of semiconductor devices and processing and, in particular, self-aligned gate edge and local interconnect structures and methods of fabricating self-aligned gate edge and local interconnect structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 2A-2D illustrate cross-sectional views of process operations of significance in a conventional finFET or tri-gate process fabrication scheme.

FIGS. 3A-3D illustrate cross-sectional views of process operations of significance in a self-aligned gate edge process fabrication scheme for finFET or tri-gate devices, in accordance with an embodiment of the present invention.

DESCRIPTION OF THE EMBODIMENTS

Self-aligned gate edge and local interconnect structures and methods of fabricating self-aligned gate edge and local interconnect structures are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to semiconductor structures or devices having one or more gate edge structures (e.g., as gate isolation regions) of gate electrodes of the semiconductor structures or devices. One or more embodiments are directed to the fabrication of local interconnects for such gate electrode structures. Additionally, methods of fabricating gate edge isolation structures in a self-aligned manner and/or methods of fabricating local interconnects are also described. In one or more embodiments, self-aligned gate edge structures and/or local interconnects are fabricated for logic transistors based on complementary metal oxide semiconductor (CMOS) devices.

Figure 1:
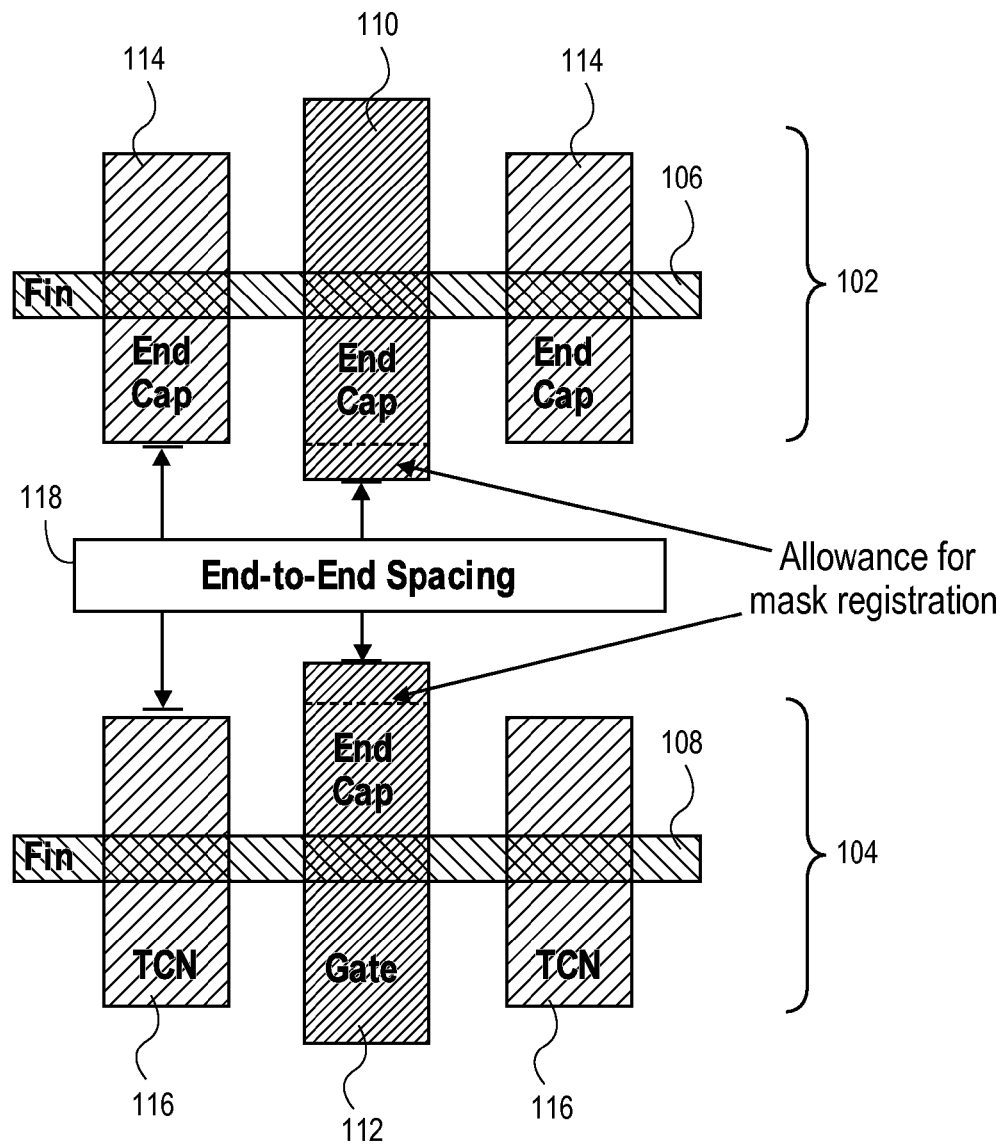
FIG. 1 illustrates a plan view of a layout including fin-based semiconductor devices accommodating end-to-end spacing.

To provide context, scaling of gate endcap and trench contact (TCN) endcap regions are important contributors towards improving transistor layout area and density. Gate and TCN endcap regions refer to gate and TCN overlap of the diffusion region/fins of semiconductor devices. As an example, FIG. 1 illustrates a plan view of a layout 100 including fin-based semiconductor devices accommodating end-to-end spacing. Referring to FIG. 1, first 102 and second 104 semiconductor devices are based on semiconductor fins 106 and 108, respectively. Each device 102 and 104 has a gate electrode 110 or 112, respectively. Additionally, each device 102 and 104 has trench contacts (TCNs) 114 and 116, respectively, at source and drain regions of the fins 106 and 108, respectively. The gate electrodes 110 and 112 and the TCNs 114 and 116 each have an end cap region, which is located off of the corresponding fins 106 and 108, respectively.

Referring again to FIG. 1, typically, gate and TCN endcap dimensions must include an allowance for mask registration error to ensure robust transistor operation for worst case mask mis-registration, leaving an end-to-end spacing 118. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present invention, approaches are described which provide for self-aligned gate endcap and TCN overlap of a semiconductor fin without any need to allow for mask registration. In one such embodiment, a disposable spacer is fabricated on the semiconductor fin edges which determines the gate endcap and the contact overlap dimensions. The spacer defined endcap process enables the gate and TCN endcap regions to be self-aligned to the semiconductor fin and, therefore, does not require extra endcap length to account for mask mis-registration. Furthermore, approaches described herein do not require lithographic patterning at previously required stages since the gate and TCN endcap/overlap dimensions remain fixed, leading to improvement (i.e., reduction) in device to device variability in electrical parameters.

In order to provide a side-by-side comparison, FIGS. 2A-2D illustrate cross-sectional views of process operations of significance in a conventional finFET or tri-gate process fabrication scheme, while FIGS. 3A-3D illustrate cross-sectional views of process operations of significance in a self-aligned gate edge process fabrication scheme for finFET or tri-gate devices, in accordance with an embodiment of the present invention.

Figure 2A:
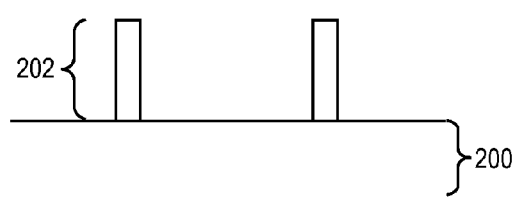
Figure 3A:
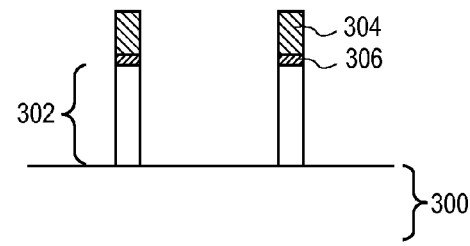

Referring to FIGS. 2A and 3A, a bulk semiconductor substrate 200 or 300, such as a bulk single crystalline silicon substrate is provided having fins 202 or 302, respectively, etched therein. In an embodiment, the fins are formed directly in the bulk substrate 200 or 300 and, as such, are formed continuous with the bulk substrate 200 or 300. It is to be appreciated that within the substrate 200 or 300, shallow trench isolation structures may be formed between fins. Referring to FIG. 3A, a hardmask layer 304, such as a silicon nitride hardmask layer, and a pad oxide layer 306, such as a silicon dioxide layer, remain atop fins 302 following patterning to form the fins 302. By contrast, referring to FIG. 2A, such a hardmask layer and pad oxide layer have been removed.

Figure 2B:
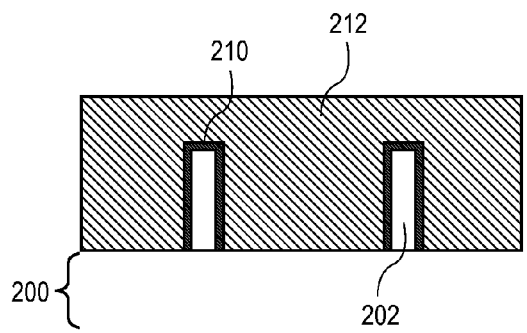
Figure 3B:
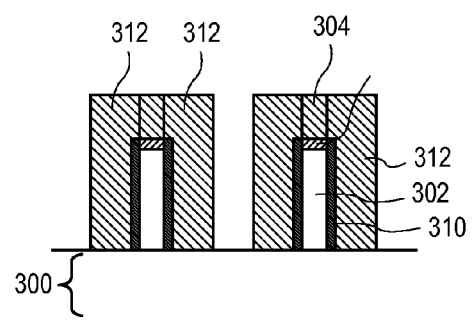

Referring to FIG. 2B, a dummy or permanent gate dielectric layer 210 is formed on the exposed surfaces of the semiconductor fins 202, and a dummy gate layer 212 is formed over the resulting structure. By contrast, referring to FIG. 3B, a dummy or permanent gate dielectric layer 310 is formed on the exposed surfaces of the semiconductor fins 302, and dummy spacers 312 are formed adjacent to the resulting structure.

Referring to FIG. 2C, gate endcap cut patterning is performed and isolation regions 214 are formed at the resulting patterned dummy gate ends 216. In the conventional process scheme, a larger gate endcap must be fabricated to allow for gate mask mis-registration, as depicted by the arrowed regions 218. By contrast, referring to FIG. 3C, self-aligned isolation regions 314 are formed by providing an isolation layer over the structure of FIG. 3B, e.g., by deposition and planarization. In one such embodiment, the self-aligned gate endcap process does not require extra space for mask registration, as compared in FIGS. 2C and 3C.

Referring to FIG. 2D, the dummy gate electrode 212 of FIG. 2C is replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 220 over a first semiconductor fin 202A and to provide a P-type gate electrode 222 over a second semiconductor fin 202B. The N-type gate electrode 220 and the P-type gate electrode 222 are formed between the gate edge isolations structures 214, but form a P/N junction 224 where they meet. The exact location of the P/N junction 224 may vary, depending on mis-registration, as depicted by the arrowed region 226.

By contrast, referring to FIG. 3D, the hardmask layer 304 and pad oxide layer 306 are removed, and the dummy spacers 314 of FIG. 3C are replaced with permanent gate electrodes. In the case of use of a dummy gate dielectric layer, such a dummy gate dielectric layer may also be replaced by a permanent gate dielectric layer in this process. In the specific example shown, a dual metal gate replacement process is performed to provide an N-type gate electrode 320 over a first semiconductor fin 302A and to provide a P-type gate electrode 322 over a second semiconductor fin 302B. The N-type gate electrode 320 and the P-type gate electrode 322 are formed between, and are also separated by, the gate edge isolations structures 314.

Referring again to FIG. 2D, a local interconnect 240 may be fabricated to contact N-type gate electrode 220 and P-type gate electrode 322 to provide a conductive path around the P/N junction 224. Likewise, referring to FIG. 3D, a local interconnect 340 may be fabricated to contact N-type gate electrode 320 and P-type gate electrode 322 to provide a conductive path over the intervening isolation structure 314 there between. Referring to both FIGS. 2D and 3D, a hardmask 242 or 342 may be formed on the local interconnect 240 or 340, respectively.

In another aspect, a hardmask and pad oxide layer may not be retained atop patterned find throughout a dummy spacer and self-aligned gate edge isolations structure fabrication process. As such, the height of the semiconductor fins relative to the height of the dummy spacers may need to be differentiated in another way. As an example, FIGS. 4A-4G illustrate cross-sectional views and corresponding top views of process operations in another self-aligned gate edge process fabrication scheme for finFET or tri-gate devices, in accordance with another embodiment of the present invention.

Figure 4A:
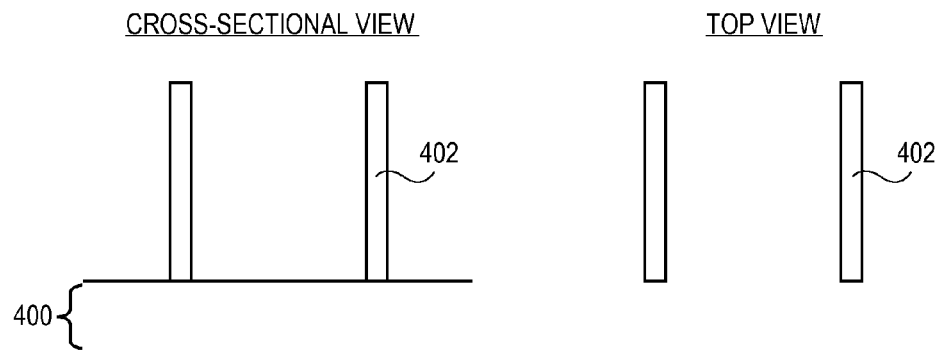
FIGS. 4A-4G illustrate cross-sectional views and corresponding top views of process operations in another self-aligned gate edge process fabrication scheme for finFET or tri-gate devices, in accordance with another embodiment of the present invention.

Referring to FIG. 4A, a bulk semiconductor substrate 400, such as a bulk single crystalline silicon substrate, is provided having fins 402 etched therein. In an embodiment, the fins 402 are formed directly in the bulk substrate 400 and, as such, are formed continuous with the bulk substrate 400. It is to be appreciated that within the substrate 400, shallow trench isolation structures may be formed between fins. In one embodiment, artifacts from patterning the fins 402, such as a hardmask layer and a pad oxide layer, have been removed, as is depicted in FIG. 4A.

Figure 4B:
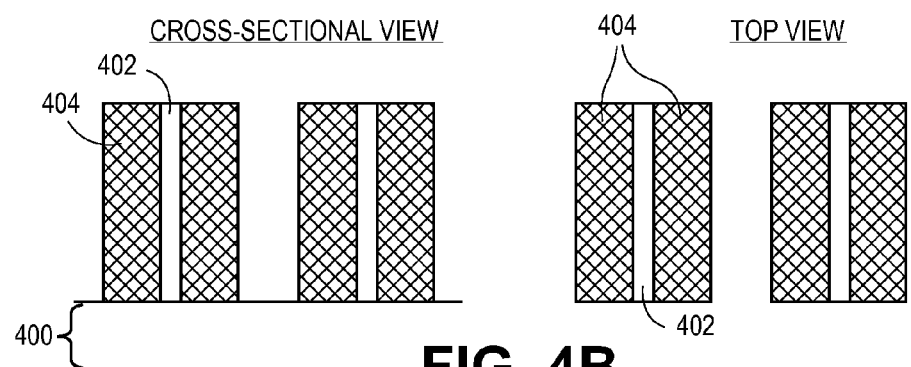

Referring to FIG. 4B, dummy spacers 404 are formed along the sidewalls of the fins 402. In an embodiment, the dummy spacers 404 are formed by a deposition and etch process that ultimately exposes the top surface of the fins 402. It is to be appreciated that the fins 402 may be passivated, e.g., by deposition or growth of a dummy gate dielectric layer, prior to the formation of the dummy spacers 404. In one embodiment, the fins 402 are silicon fins passivated with a silicon dioxide layer, and the dummy spacers are fabricated from silicon nitride or like material. In another embodiment, however the fins 402 are not passivated at this stage.

Figure 4C:
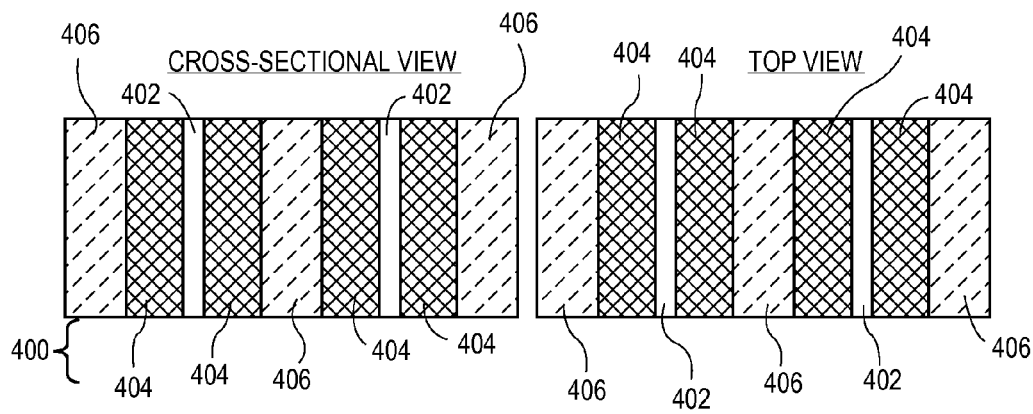

Referring to FIG. 4C, isolations structures 406 are formed in the open regions of the structure of FIG. 4B. In an embodiment, the isolation regions 406 are formed by deposition and subsequent planarization (e.g., by chemical mechanical polishing) of a dielectric film over the structure of FIG. 4B. In a particular embodiment, the isolation structures are composed of a material such as, but not limited to, silicon oxide, silicon nitride, silicon carbide, or a combination thereof.

Figure 4D:
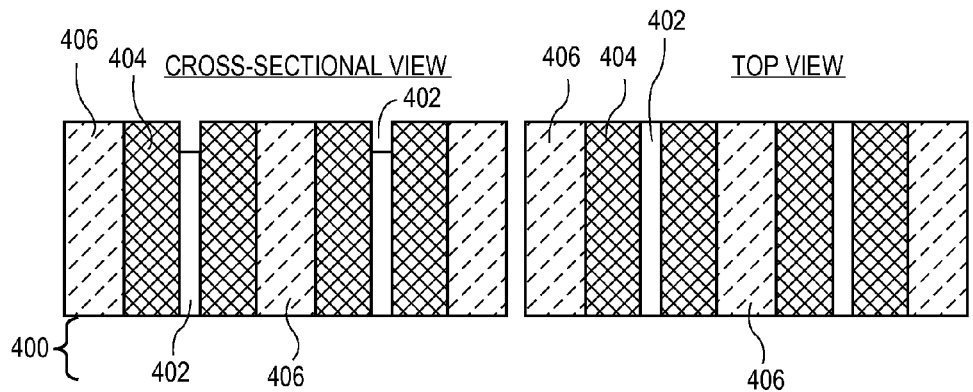

Referring to FIG. 4D, the fins 402 are recessed relative to the height of the isolation structures 406 and relative to the height of the dummy spacers 404. In an embodiment, the recessing is performed by using a selective etch process. In one such embodiment, a passivation layer first formed on fins 402 is removed prior to or during the recessing of the fins 402.

Figure 4E:
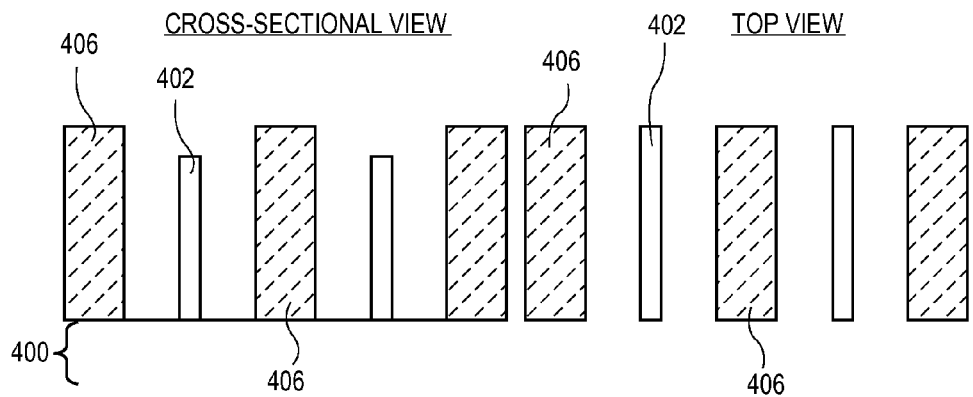

Referring to FIG. 4E, the dummy spacers 404 are removed from the structure of FIG. 4D. In an embodiment, the removal is performed by using a selective etch process. In one such embodiment, the isolation structures 406 are composed of silicon oxide, the fins 402 are composed of silicon, and the selectively removed dummy spacers are composed of silicon nitride.

Figure 4F:
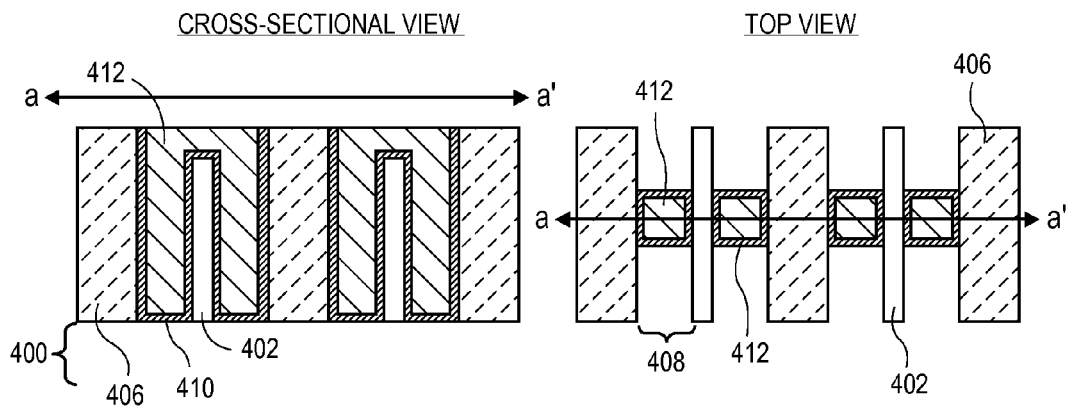

Referring to FIG. 4F, a gate electrode stack 408 is formed in the locations from which dummy spacers 404 were removed and along the top surfaces of the recessed fins 402. In an embodiment, the gate electrode stack 408 includes a conformal gate dielectric layer 410, such as a high-k gate dielectric layer, and a metal gate electrode 412. The cross-sectional view of FIG. 4F is taken along the a-a' axis of the top view of FIG. 4F. It is to be understood, however, that the top view is taken somewhat deeper into the structure in order to show the whole fins 402. In actuality, the metal gate material 412 would cover the fins 402 in the top view.

Figure 4G:
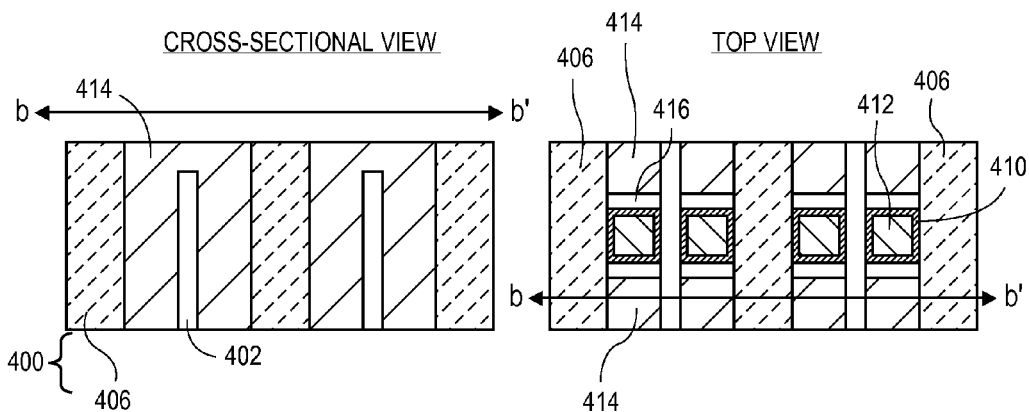

Referring to FIG. 4G, trench contacts 414 are formed adjacent to the gate electrode stacks 408 and along the top surfaces of the recessed fins 402. In an embodiment, the trench contacts 414 are for contacting source and drain regions within the fins 402, and are separated from the gate electrode stacks 408 by dielectric spacers 416. The cross-sectional view of FIG. 4G is taken along the b-b' axis of the top view of FIG. 4G. It is to be understood, however, that the top view is taken somewhat deeper into the structure in order to show the whole fins 402. In actuality, the trench contacts 414 would cover the fins 402 in the top view.

In another aspect, referring again to FIG. 3D, in an embodiment, one or more of the above approaches requires an additional local interconnect layer (LI) above gate and trench contact (TCN) to connect adjacent gates and TCN electrodes. In one such embodiment, such a local interconnect must overlap gate and TCN, without creating contact to gate (CTG) shorting. As such, fabrication of the local interconnect can require patterning of lines at ½ of gate pitch with good CTG short margin, while maintaining robust LI to TCN contact. Hence, the alignment between LI and gate or TCN is another difficult patterning problem. As such, in accordance with an embodiment of the present invention, in order to address the above concern, a fabrication scheme for local interconnect lines which are self-aligned to gate and TCN without any need to allow for mask registration is provided. The approach involves fabrication of a spacer along a taller stack that includes a dummy gate and hardmask and which extends above the self-aligned gate endcap. In one such embodiment, the spacers serve as continuous self-aligned walls separating gate and contact. Two additional dielectric materials with contrasting etch properties may be used as hardmasks to allow for selectively opening an area for gate-LI (LIG) and TCN-LI (LIT).

Figure 5A:
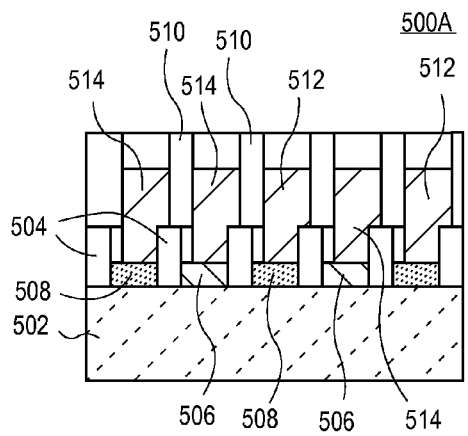
FIG. 5A illustrates a cross-sectional view of a portion of a semiconductor device having self-aligned gate/trench contact endcap (SAGE) with a pitch division patterned local interconnect (LI), in accordance with one embodiment of the present invention.

As an example, FIG. 5A illustrates a cross-sectional view of a portion of a semiconductor device having self-aligned gate/trench contact endcap (SAGE) with a pitch division patterned local interconnect (LI), in accordance with one embodiment of the present invention. By contrast, FIG. 5B illustrates a cross-sectional view of a portion of a semiconductor device having self-aligned gate/trench contact endcap (SAGE) with a self-aligned local interconnect (SAGELI), in accordance with another embodiment of the present invention.

Referring to FIG. 5A, a semiconductor device 500A includes a semiconductor fin 502. A plurality of short self-aligned isolation structures 504 separate alternating gate 506 and trench contact 508 regions. Upper isolation structures 510 separate alternating trench contact local interconnects 512 and gate local interconnects 514. The trench contact local interconnects 512 and gate local interconnects 514 are formed by pitch division patterning to accommodate for mis-registration, as is shown in FIG. 5A. It is to be appreciated that dielectric caps may be formed on the trench contact local interconnects 512 and gate local interconnects 514, as is also depicted in FIG. 5A.

Figure 5B:
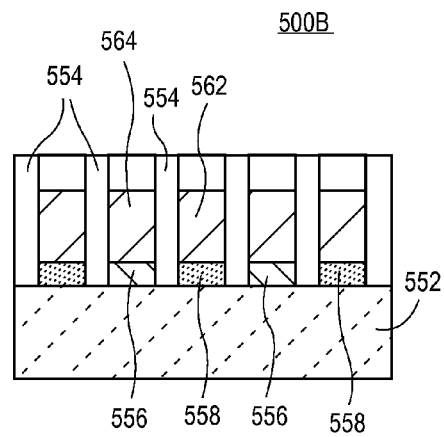
FIG. 5B illustrates a cross-sectional view of a portion of a semiconductor device having self-aligned gate/trench contact endcap (SAGE) with a self-aligned local interconnect (SAGELI), in accordance with another embodiment of the present invention.

Referring to FIG. 5B, a semiconductor device 500B includes a semiconductor fin 552. A plurality of tall self-aligned isolation structures 554 separate alternating gate 556 and trench contact 558 regions. The same isolation structures 554 also separate alternating trench contact local interconnects 562 and gate local interconnects 564. The trench contact local interconnects 512 and gate local interconnects 514 are formed without using an additional lithography operation as was need for the case of FIG. 5A. It is to be appreciated that dielectric caps may be formed on the trench contact local interconnects 562 and gate local interconnects 564, as is depicted in FIG. 5B. It is also to be appreciated that the trench contact local interconnects 512 and gate local interconnects 514 are, in an embodiment, fabricated at different times, the process for forming each taking advantage of the use of plugs/hardmask layers as placeholders prior to replacement with the actual permanent materials of the trench contact local interconnects 512 and gate local interconnects 514. Furthermore, although all locations in FIG. 5B are shown as having a gate local interconnect or trench contact local interconnect, not all locations need be selected for local interconnection. In locations not selected a dielectric plug or hardmask may remain (i.e., it is not selected for removal at certain locations).

As exemplary approaches, FIGS. 6A-6H illustrate angled, three-dimensional cross-sectional views of various operations in the fabrication of self-aligned gate endcaps, in accordance with an embodiment of the present invention. FIGS. 7A-7D illustrate angled, three-dimensional cross-sectional views of various structural options for providing a foundation for local interconnect fabrication, in accordance with an embodiment of the present invention.

Figure 6A:
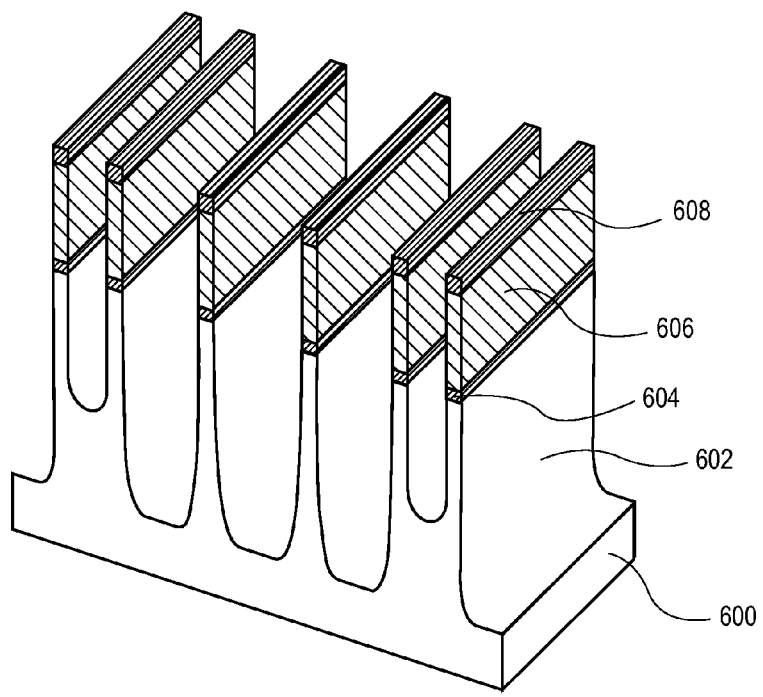
FIGS. 6A-6H illustrate angled, three-dimensional cross-sectional views of various operations in the fabrication of self-aligned gate endcaps, in accordance with an embodiment of the present invention.

Referring to FIG. 6A, a plurality of semiconductor fins 602 is formed by patterning a substrate 600, such as a single crystalline silicon substrate, and the patterning may involve pitch halving or pitch quartering patterning. Furthermore, a passivation layer 604, a dummy gate layer 606 (such as a polycrystalline silicon layer), and a hardmask layer 608 are patterned during the fin 602 patterning.

Figure 6B:
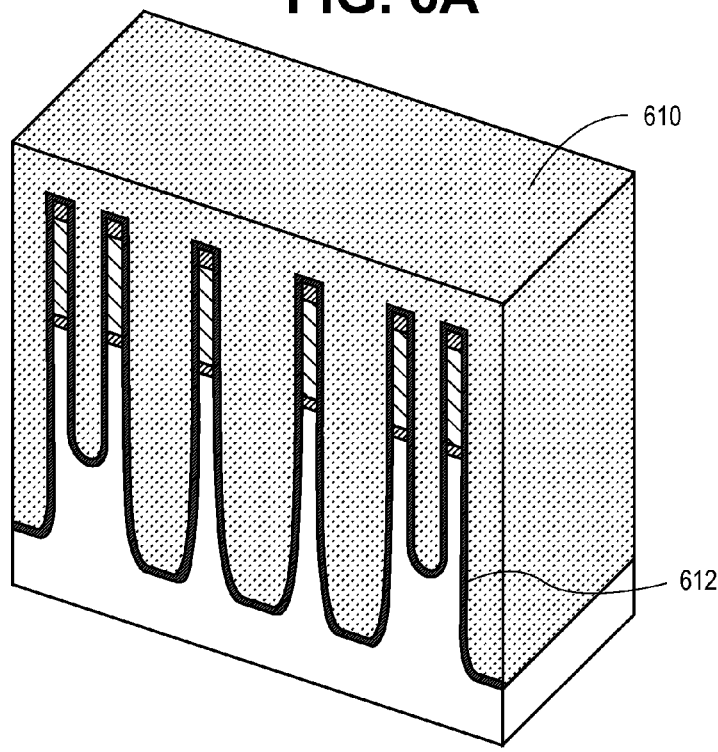

Referring to FIG. 6B, a shallow trench isolation (STI) layer 610 is formed over the structure of FIG. 6A. In an embodiment, the STI layer 610 includes a silicon dioxide layer and is formed by chemical vapor deposition (CVD) and subsequent chemical mechanical planarization (CMP). In one embodiment, the STI structure includes a liner dielectric layer 612, as shown in FIG. 6B.

Figure 6C:
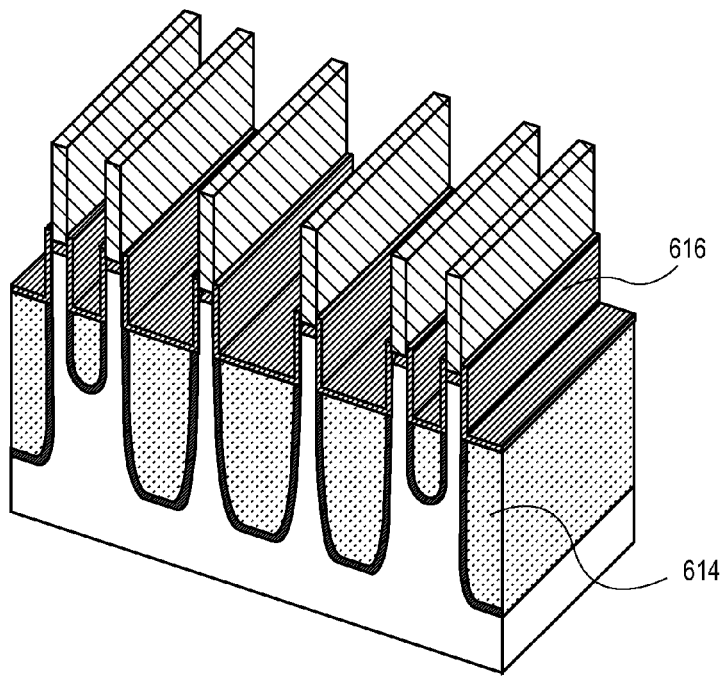

Referring to FIG. 6C, the STI layer 610 of FIG. 6B is recessed to form an STI structure 614 (which may include a liner dielectric layer) and a dummy gate dielectric layer 616 is formed on the resulting structure. In one such embodiment, the dummy gate dielectric layer 616 is formed by deposition and is further deposited on the STI structure 614, as depicted. Furthermore, hardmask layer 608 may be removed, as is also depicted.

Figure 6D:
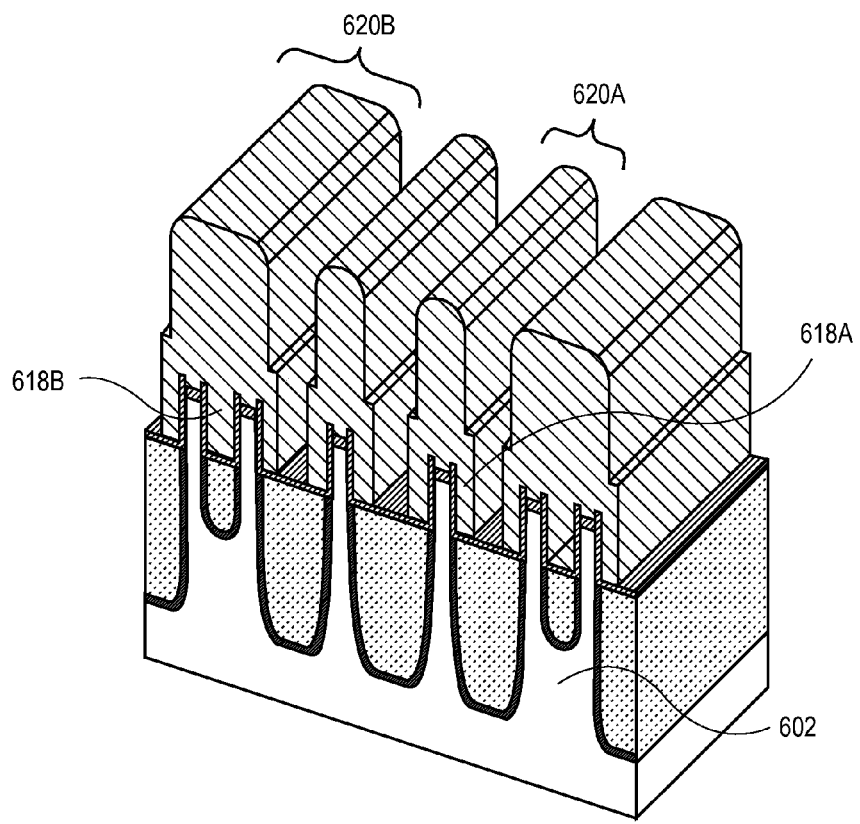

Referring to FIG. 6D, spacers 618 are formed along the sidewalls of the protruding portions of the structure of FIG. 6C. In an embodiment, the spacers 618 are formed by a deposition and subsequent anisotropic etch process. In one such embodiment, the spacers are composed of deposited polycrystalline silicon. Depending on the spacing between certain of the fins 602, some spacers 618 are discrete from all other spacers, while some spacers are continuous with another spacer. As an example, the portion 620A has discrete spacers 618A, while the portion 620B includes a pair of continuous spacers 618B. Thus, referring collectively to FIGS. 6A-6D, a finFET "hat" and dummy gate poly are patterned with a standard pitch division fin patterning process and a spacer is created on both sides of the patterned fin-poly pillars.

Figure 6E:
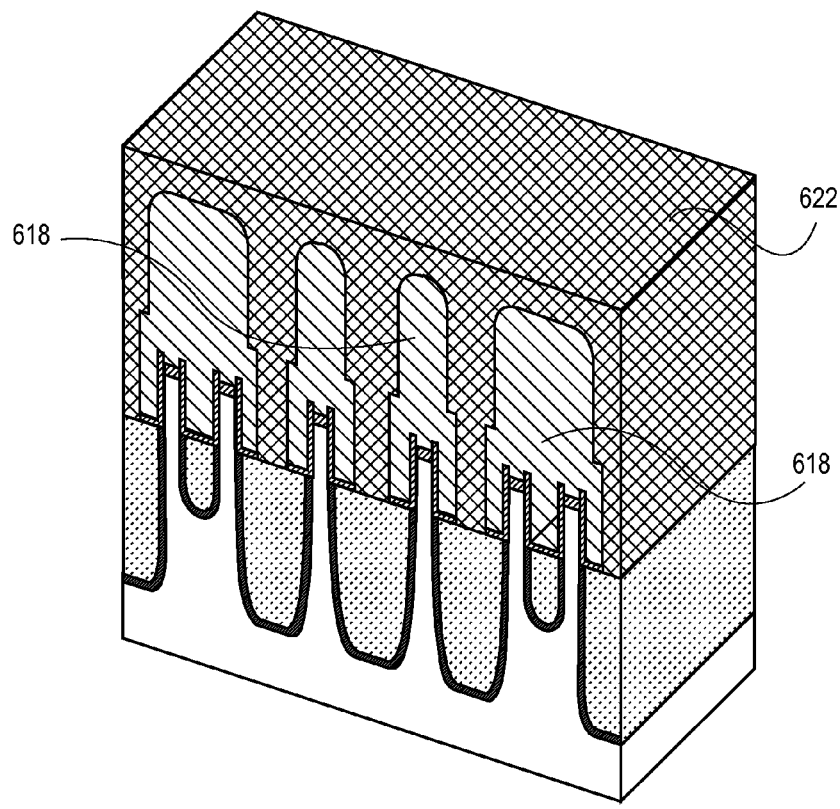

Referring to FIG. 6E, the gaps between the spacers 618 of FIG. 6D are filled with a dielectric material layer 622 to create transistor isolations. In an embodiment, the dielectric material is composed of a silicon nitride material.

Figure 6F:
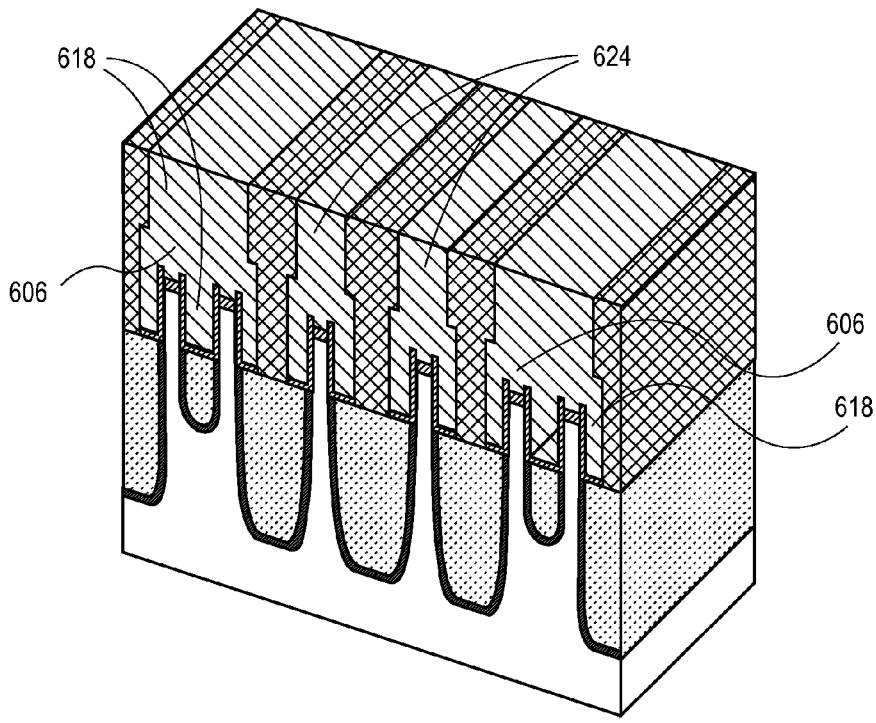

Referring to FIG. 6F, the dielectric material layer 622 is planarized (e.g., by CMP) to expose the dummy gate layer 606 and the corresponding spacers 618. In an embodiment, both the dummy gate layer 606 and the corresponding spacers 618 are composed of polycrystalline silicon. The process forms self-aligned end cap isolation walls 624.

Figure 6G:
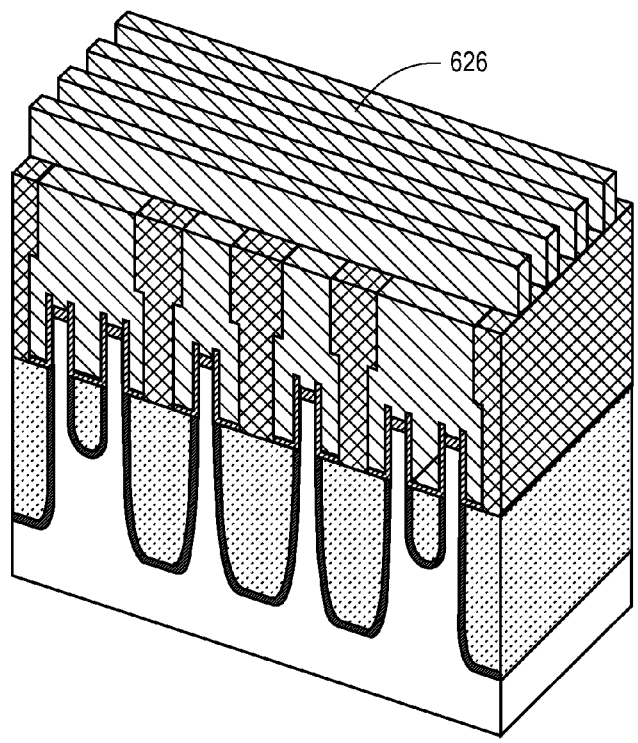
Figure 6H:
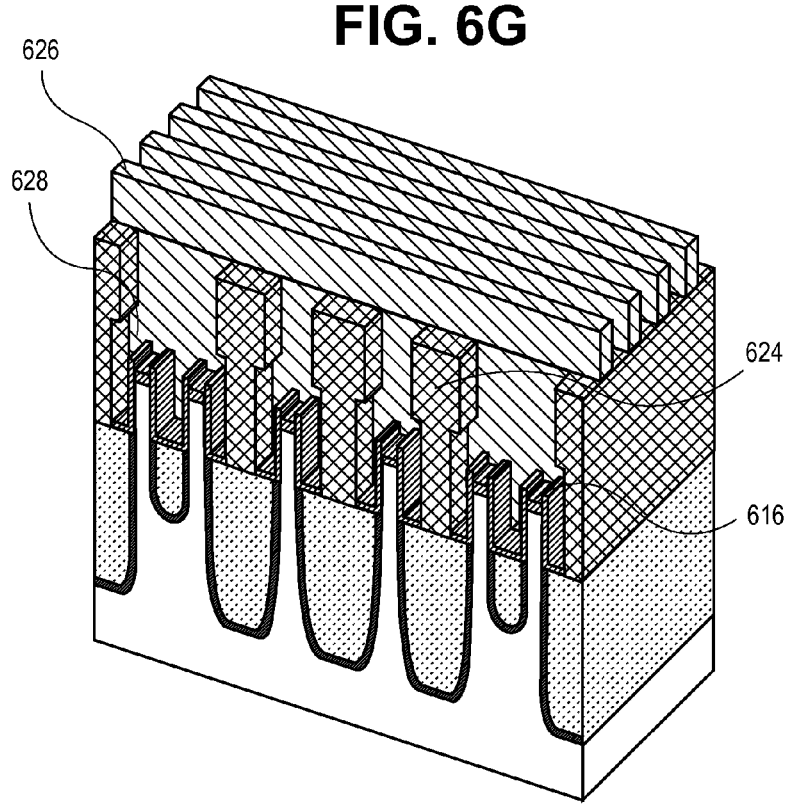

Referring to FIG. 6G, a second dummy layer and hardmask stack or a tall hardmask only are/is deposited and patterned using pitch division gate patterning (both cases shown as item 626 in FIG. 6G) on the structure of FIG. 6H.

In an embodiment, in the case that a dummy layer and hardmask stack is used, the dummy layer is composed of polycrystalline silicon.

Referring to FIG. 6H, an anisotropic etch selective to hardmask layer 626, isolation walls 624 and finFET "hat" 616 (e.g., remaining from the dummy gate dielectric layer) is performed to provide a straight profile between patterned lines and resulting endcap isolation cages 628. Although not shown, following gate spacer formation, N-type or P-type source drain formation, and gate electrode replacement (e.g., with high-k/metal gate), a conductive material can be formed in the endcap isolation cages 628 to provide trench contacts. And, in cases where the isolation walls are of sufficient height, self-aligned local interconnect lines may be fabricated, examples of which are described below in association with FIGS. 7C and 7D.

Figure 7A:
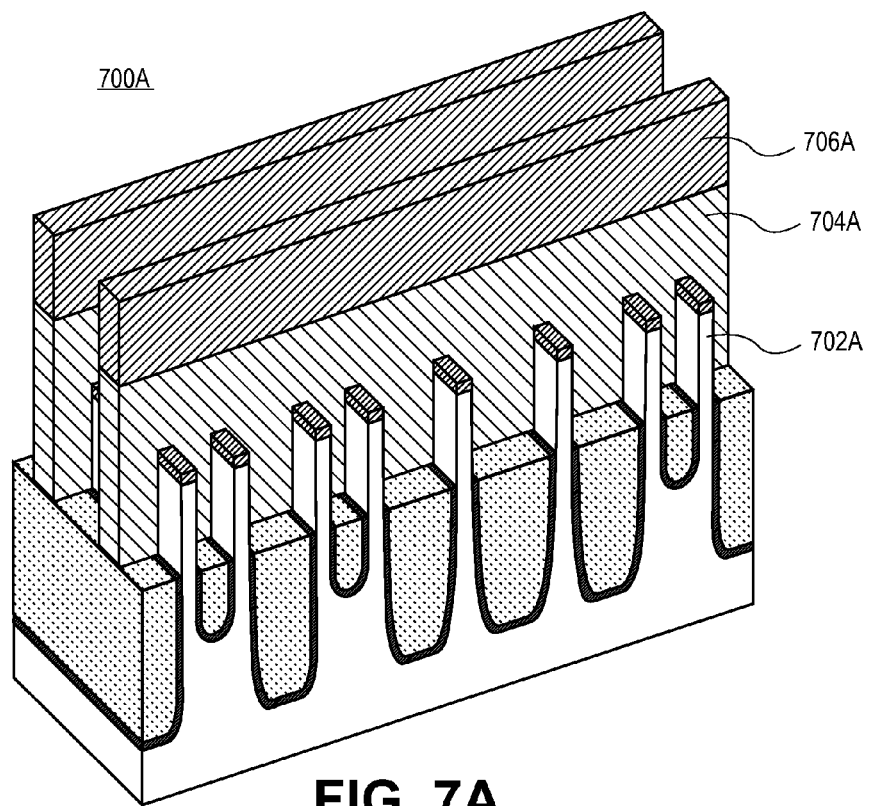
FIGS. 7A-7D illustrate angled, three-dimensional cross-sectional views of various structural options for providing a foundation for local interconnect fabrication, in accordance with an embodiment of the present invention.

To provide an initial comparison, FIG. 7A illustrates an angled, three-dimensional cross-sectional view of a foundational structure 700A without self-aligned gate edge isolation. Referring to FIG. 7A, a plurality of fins 702A has a dummy gate layer 704A and corresponding hardmask 706A patterned thereon. In the subsequent fabrication of local interconnects, a pitch divisional patterning scheme would have to be employed.

Figure 7B:
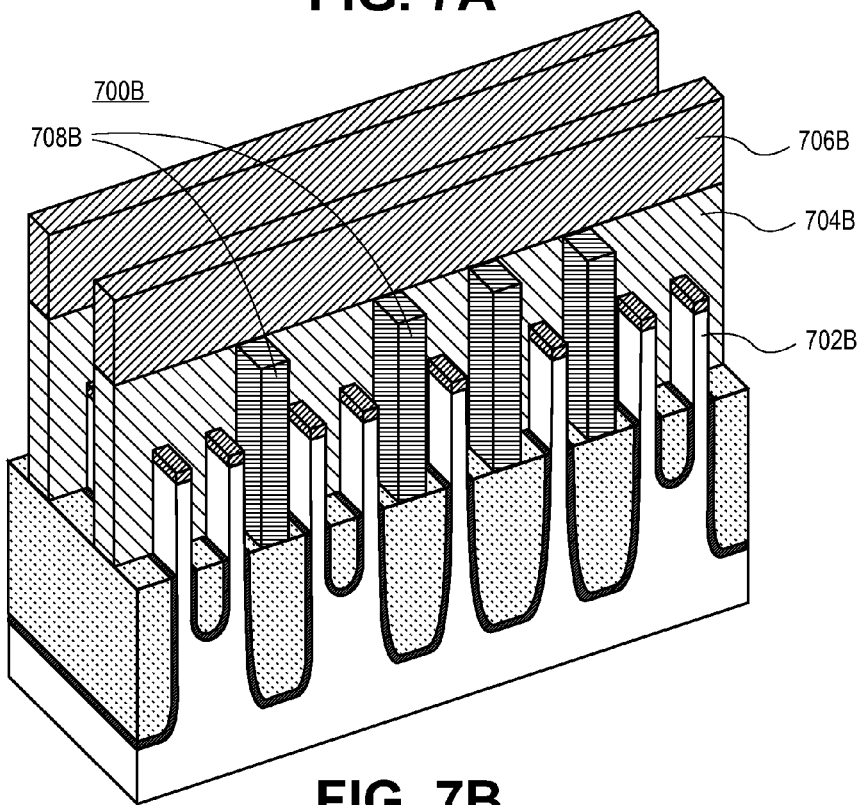

FIG. 7B illustrates an angled, three-dimensional cross-sectional view of a foundational structure 700B having self-aligned gate edge isolation. Referring to FIG. 7B, a plurality of fins 702B has a dummy gate layer 704B and corresponding hardmask 706B patterned thereon. Self-aligned gate edge isolation structures 708B are formed between various groupings of the fins 702B. However, the hardmask 706B is relatively short compared with the self-aligned gate edge isolation structures 708B. As such, in the subsequent fabrication of local interconnects, a pitch divisional patterning scheme would have to be employed.

Figure 7C:
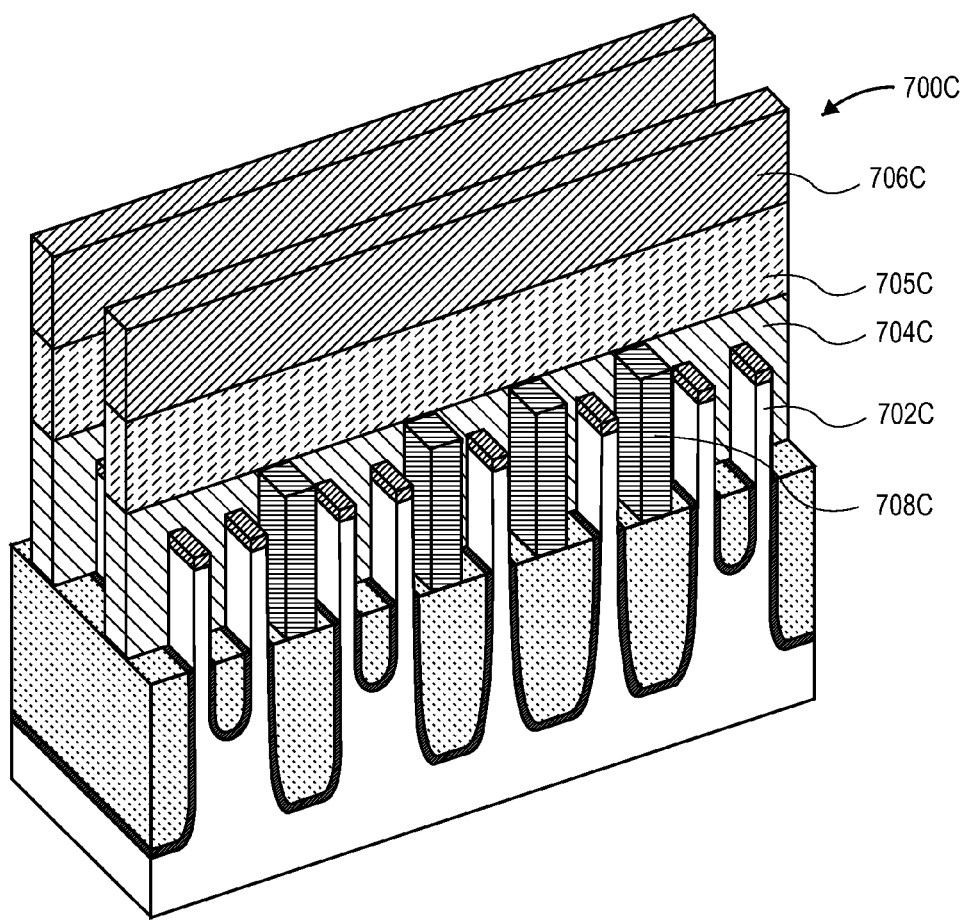

FIG. 7C illustrates an angled, three-dimensional cross-sectional view of a foundational structure 700C having self-aligned gate edge isolation. Referring to FIG. 7C, a plurality of fins 702C has a dummy gate layer 704C, corresponding second dummy layer 705C, and corresponding hardmask 706C patterned thereon. Self-aligned gate edge isolation structures 708C are formed between various groupings of the fins 702C. The height of the hardmask 706C together with the second dummy layer 705C is relatively tall compared with the self-aligned gate edge isolation structures 708C. As such, in the subsequent fabrication of local interconnects, a self-aligned local interconnect scheme may be employed.

Figure 7D:
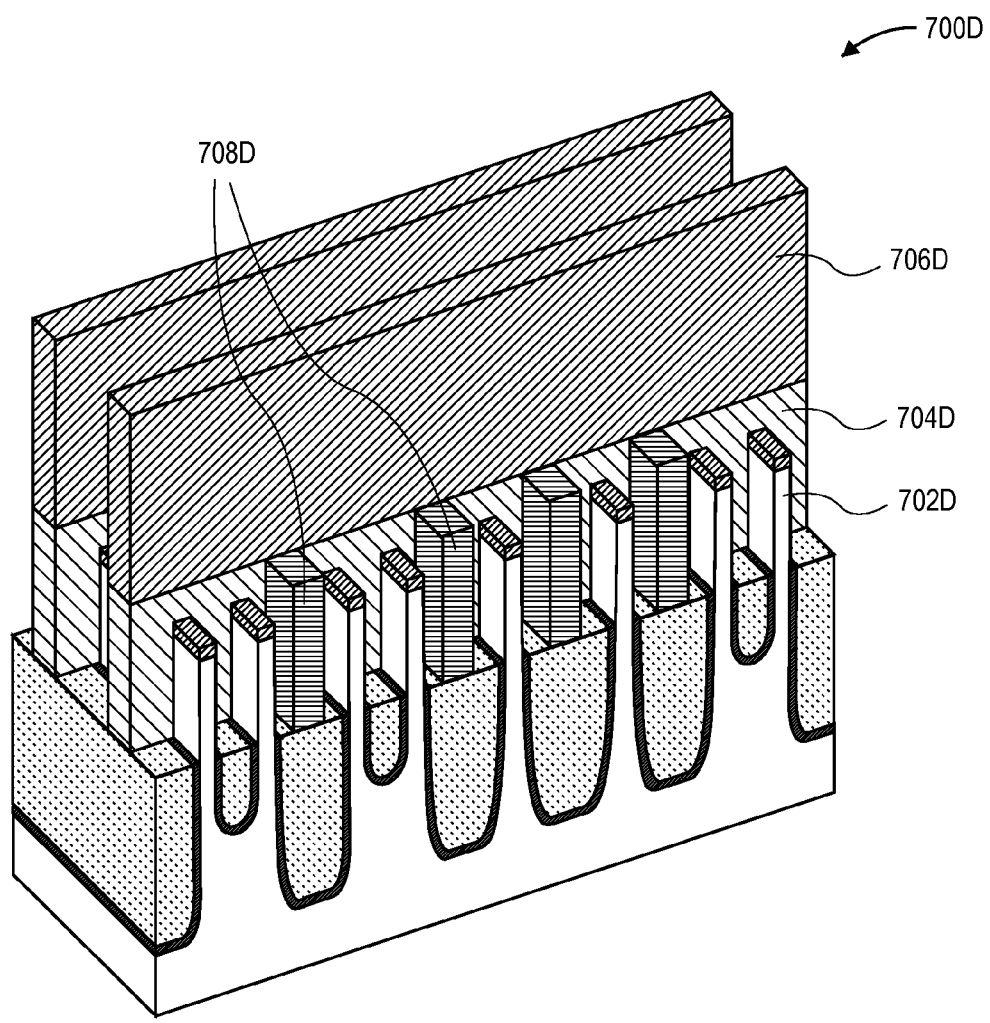

FIG. 7D illustrates an angled, three-dimensional cross-sectional view of a foundational structure 700D having self-aligned gate edge isolation. Referring to FIG. 7D, a plurality of fins 702D has a dummy gate layer 704D and a corresponding tall hardmask 706D patterned thereon. Self-aligned gate edge isolation structures 708D are formed between various groupings of the fins 702D. The height of the tall hardmask 706D is relatively tall compared with the self-aligned gate edge isolation structures 708D. As such, in the subsequent fabrication of local interconnects, a self-aligned local interconnect scheme may be employed.

More generally, one or more embodiments described herein provide an avenue for area scaling, reducing capacitance, and/or eliminating various critical front end masks, such as gate cut masks. In one such embodiment the width of a minimum transistor can be reduced by up to 30% by implementing one or more of the approaches describe herein. The smaller transistor size reduces the capacitance between the gate and TCN and other parasitic capacitances.

No extra mask steps are needed to create the endcaps, contacts and local interconnect lines so the many masks needed for such features in the standard process are eliminated.

More specifically, key features of one or more embodiments described above may include one or more of: (1) the gate endcap is the distance from the fin edge to the isolation edge. This distance is defined by the spacer width and is the same size for all transistors. No lithographic patterning is needed to define the endcap so there is no need to allow for mask registration in the endcap. (2) The TCN overlap of the fin is determined by the spacer width and is also not affected by mask registration. (3) The local interconnect lines are self-aligned to the gate and TCN by utilizing the gate patterning lines above the transistor isolation walls to form three distinct hardmasks that can be selectively opened one at a time. Embodiments may be applicable to the 7 nm node generation, e.g., to improve transistor layout density and gate capacitance (dynamic energy and performance improvement) and reduce total mask count.

It is to be appreciated that the structures resulting from the above exemplary processing schemes may be used in a same or similar form for subsequent processing operations to complete device fabrication, such as PMOS and NMOS device fabrication. As an example of a completed device, FIGS. 8A and 8B illustrate a cross-sectional view and a plan view (taken along the a-a' axis of the cross-sectional view), respectively, of a non-planar semiconductor device having self-aligned gate edge isolation, in accordance with an embodiment of the present invention, and as building on the structure described in association with FIG. 3D.

Figure 8A:
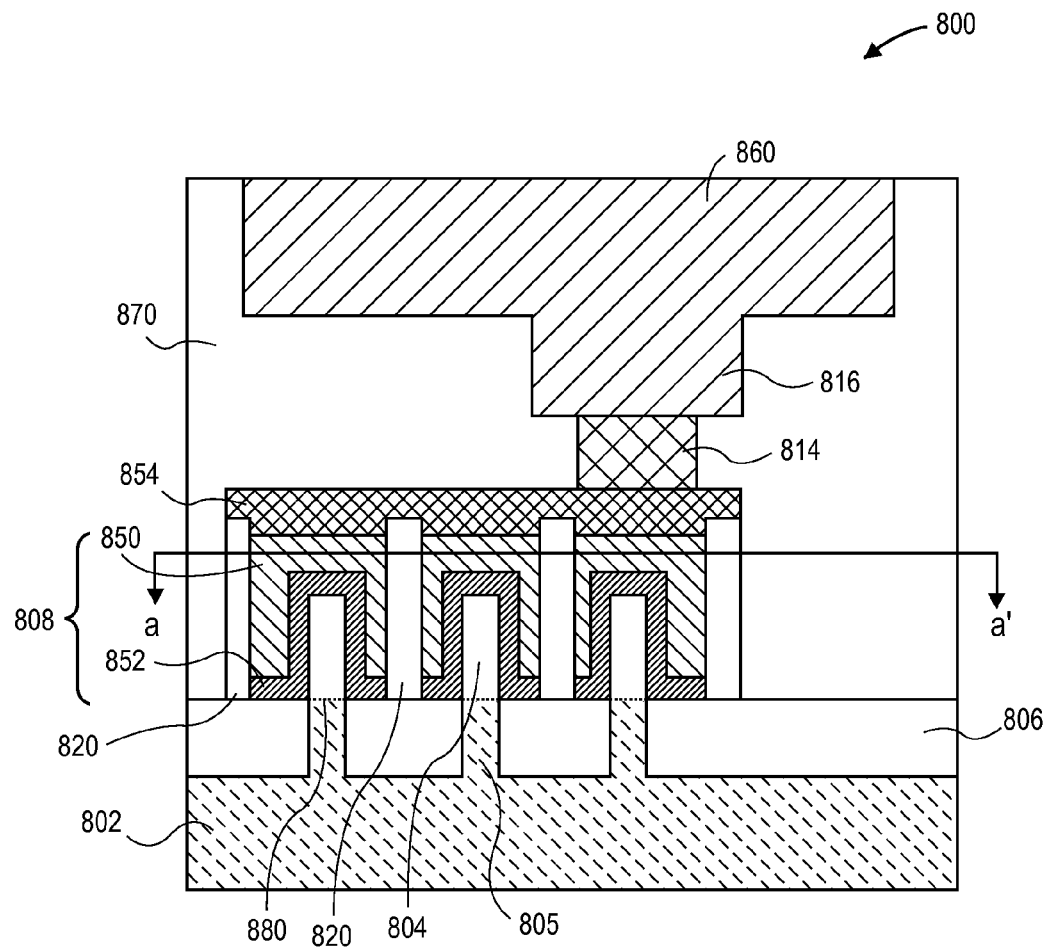
FIG. 8A illustrates a cross-sectional view of a non-planar semiconductor device having self-aligned gate edge isolation, in accordance with an embodiment of the present invention.

Referring to FIG. 8A, a semiconductor structure or device 800 includes a non-planar active regions (e.g., a fin structures including protruding fin portion 804 and sub-fin region 805) formed from substrate 802, and within isolation region 806. Gate structures 808 are disposed over the protruding portions 804 of the non-planar active regions as well as over a portion of the isolation region 806. As shown, gate structures 808 include a gate electrode 850 and a gate dielectric layer 852. In one embodiment, although not shown, gate structures 808 may also include a dielectric cap layer. Gate structures 808 are separated by self-aligned gate edge isolation structures 820. A local interconnect 854 coupled adjacent gate structures 808. A gate contact 814, and overlying gate contact via 816 are also seen from this perspective, along with an overlying metal interconnect 860, all of which are disposed in inter-layer dielectric stacks or layers 870. Also seen from the perspective of FIG. 8A, the gate contact 814 is, in one embodiment, disposed over the non-planar active regions. As is also depicted in FIG. 8A, an interface 880 exists between a doping profile of protruding fin portions 804 and sub-fin regions 805, although other embodiments do not include such an interface in doping profile between these regions.

Figure 8B:
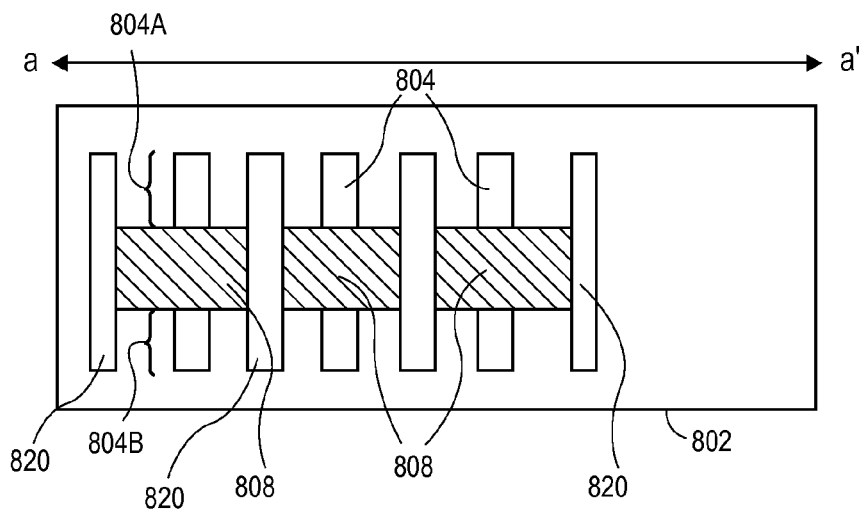
FIG. 8B illustrates a plan view taken along the a-a' axis of the semiconductor device of FIG. 8A, in accordance with an embodiment of the present invention.

Referring to FIG. 8B, the gate structures 808 are shown as disposed over the protruding fin portions 804, as isolated by self-aligned gate edge isolation structures 820. Source and drain regions 804A and 804B of the protruding fin portions 804 are shown in this perspective, although it is to be understood that these regions would be overlapped with trench contact structures. In one embodiment, the source and drain regions 804A and 804B are doped portions of original material of the protruding fin portions 804. In another embodiment, the material of the protruding fin portions 804 is removed and replaced with another semiconductor material, e.g., by epitaxial deposition. In either case, the source and drain regions 804A and 804B may extend below the height of dielectric layer 806, i.e., into the sub-fin region 805.

In an embodiment, the semiconductor structure or device 800 is a non-planar device such as, but not limited to, a finFET or a tri-gate device. In such an embodiment, a corresponding semiconducting channel region is composed of or is formed in a three-dimensional body. In one such embodiment, the gate structures 808 surround at least a top surface and a pair of sidewalls of the three-dimensional body.

Substrate 802 may be composed of a semiconductor material that can withstand a manufacturing process and in which charge can migrate. In an embodiment, substrate 802 is a bulk substrate composed of a crystalline silicon, silicon/germanium or germanium layer doped with a charge carrier, such as but not limited to phosphorus, arsenic, boron or a combination thereof, to form active region 804. In one embodiment, the concentration of silicon atoms in bulk substrate 802 is greater than 97%. In another embodiment, bulk substrate 802 is composed of an epitaxial layer grown atop a distinct crystalline substrate, e.g. a silicon epitaxial layer grown atop a boron-doped bulk silicon mono-crystalline substrate. Bulk substrate 802 may alternatively be composed of a group III-V material. In an embodiment, bulk substrate 802 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 802 is composed of a III-V material and the charge-carrier dopant impurity atoms are ones such as, but not limited to, carbon, silicon, germanium, oxygen, sulfur, selenium or tellurium.

Isolation region 806 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 806 is composed of a dielectric material such as, but not limited to, silicon dioxide, silicon oxy-nitride, silicon nitride, or carbon-doped silicon nitride.

Self-aligned gate edge isolation structures 820 may be composed of a material suitable to ultimately electrically isolate, or contribute to the isolation of, portions of permanent gate structures from one another. For example, in one embodiment, the isolation region 806 is composed of a dielectric material such as, but not limited to, silicon dioxide, silicon oxy-nitride, silicon nitride, or carbon-doped silicon nitride.

Gate structures 808 may be composed of a gate electrode stack which includes a gate dielectric layer 852 and a gate electrode layer 850. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 802. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 854, gate contact 814, and overlying gate contact via 816 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). It is to be appreciated that a hardmask layer may be disposed on the local interconnect 854 in locations where gate contact 814 is not located thereon. Furthermore, the local interconnect 854 may be fabricated by lithographic patterning or, in other embodiments, may be fabricated as a self-aligned interconnect structure, as aligned with taller versions of the Self-aligned gate edge isolation structures 820.

In an embodiment (although not shown), providing structure 800 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate structures 808 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 800. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 8A, in an embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

Figure 9:
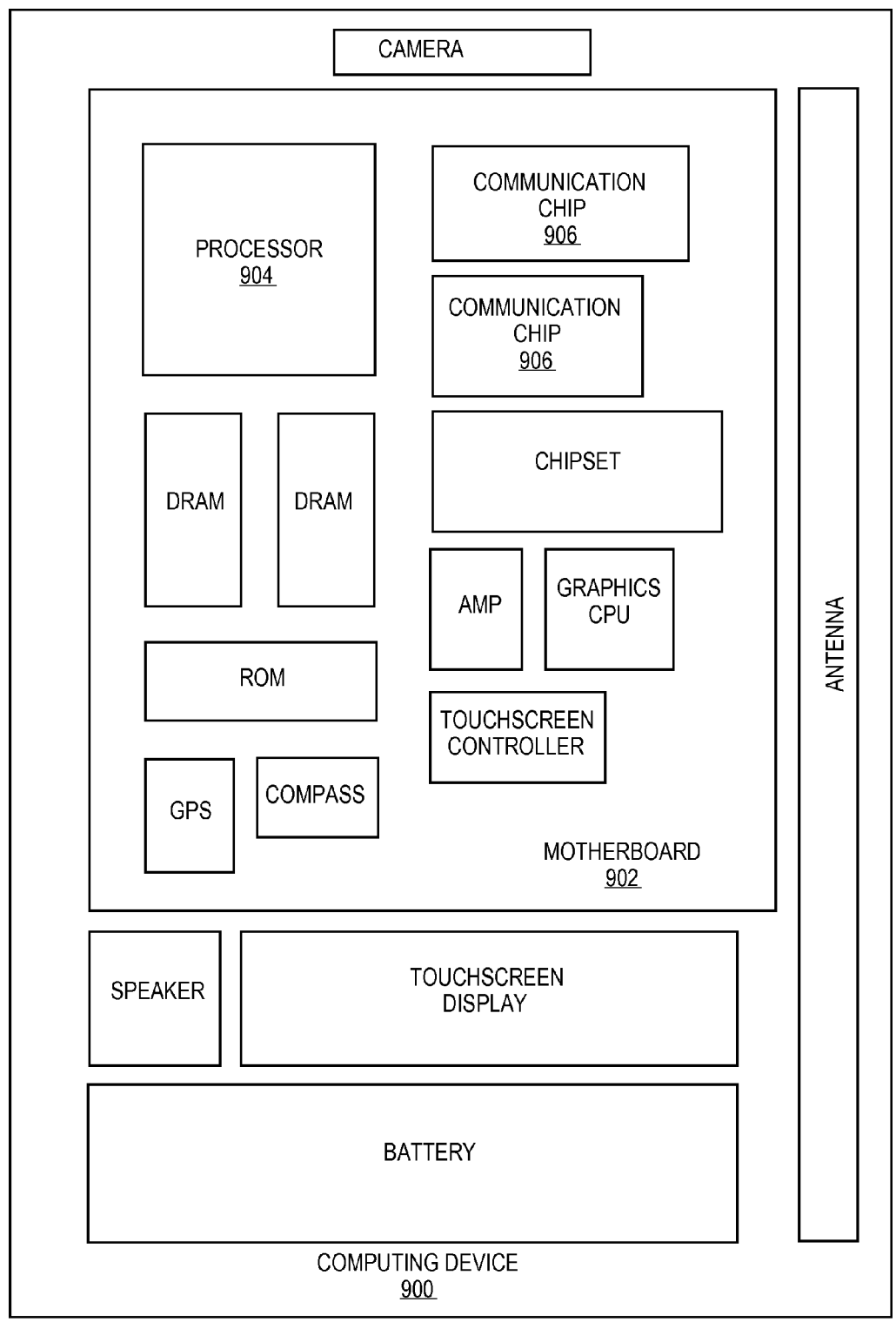
FIG. 9 illustrates a computing device in accordance with one implementation of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes one or more devices, such as MOS-FET transistors built in accordance with implementations of the invention.

In further implementations, another component housed within the computing device 900 may contain an integrated circuit die that includes one or more devices, such as MOS-FET transistors built in accordance with implementations of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments of the present invention include self-aligned gate edge and local interconnect structures and methods of fabricating self-aligned gate edge and local interconnect structures.

In an embodiment, a semiconductor structure includes a semiconductor fin disposed above a substrate and having a length in a first direction. A gate structure is disposed over the semiconductor fin, the gate structure having a first end opposite a second end in a second direction, orthogonal to the first direction. A pair of gate edge isolation structures is centered with the semiconductor fin. A first of the pair of gate edge isolation structures is disposed directly adjacent to the first end of the gate structure, and a second of the pair of gate edge isolation structures is disposed directly adjacent to the second end of the gate structure.

In one embodiment, the semiconductor structure further includes source and drain regions disposed in the semiconductor fin, on either side of the gate structure. A first trench contact is disposed over the source region and a second trench contact disposed over the drain region. Each of the first and second trench contacts has a first end opposite a second end in the second direction. The first of the pair of gate edge isolation structures is disposed directly adjacent to the first end of the first trench contact and to the first end of the second trench contact. The second of the pair of gate edge isolation structures is disposed directly adjacent to the second end of the first trench contact and to the second end of the second trench contact.

In one embodiment, the semiconductor structure further includes a second semiconductor fin disposed above the substrate and having a length in the first direction, the second semiconductor fin spaced apart from the first semiconductor fin. A second gate structure is disposed over the second semiconductor fin, the second gate structure having a first end opposite a second end in the second direction. The second of the pair of gate edge isolation structures is disposed directly adjacent to the first end of the second gate structure. A third gate edge isolation structure is disposed directly adjacent to the second end of the second gate structure. The third gate edge isolation structure and the second of the pair of gate edge isolation structures are centered with the second semiconductor fin.

In one embodiment, the semiconductor structure further includes a local interconnect disposed above and electrically coupling the first and second gate structures.

In one embodiment, the local interconnect is self-aligned with the pair of and the third gate edge isolation structures.

In one embodiment, the gate structure is an N-type gate structure, and the second gate structure is a P-type gate structure.

In one embodiment, the gate structure includes a high-k gate dielectric layer and a metal gate electrode.

In one embodiment, the pair of gate edge isolation structures is composed of a material such as, but not limited to, silicon oxide, silicon nitride, silicon carbide, or a combination thereof.

In an embodiment, a semiconductor structure includes a semiconductor fin disposed above a substrate and having a length. Alternating source/drain and channel regions are disposed in the length of the semiconductor fin, each source/drain region having an associated trench contact disposed over the semiconductor fin, and each channel region having an associated gate structure disposed over the semiconductor fin. The semiconductor structure also includes a plurality of gate edge isolation structures. An adjacent trench contact and gate structure are separated by one gate edge isolation structure of the plurality of gate edge isolation structures. A gate local interconnect is disposed above one of the gate structures and between a pair of the plurality of gate edge isolation structures.

In one embodiment, the semiconductor structure further includes a dielectric cap disposed on the gate local interconnect, the dielectric cap disposed between the pair of the plurality of gate edge isolation structures.

In one embodiment, the semiconductor structure further includes a trench contact local interconnect disposed above one of the trench contacts and between a second pair of the plurality of gate edge isolation structures.

In one embodiment, the semiconductor structure further includes a dielectric cap disposed on the trench contact local interconnect, the dielectric cap disposed between the second pair of the plurality of gate edge isolation structures.

In one embodiment, each gate structure includes a high-k gate dielectric layer and a metal gate electrode.

In one embodiment, each of the plurality of gate edge isolation structures is composed of a material such as, but not limited to, silicon oxide, silicon nitride, silicon carbide, or a combination thereof.

In an embodiment, a semiconductor structure includes a semiconductor fin disposed above a substrate and having a length. Alternating source/drain and channel regions are disposed in the length of the semiconductor fin, each source/ drain region having an associated trench contact disposed over the semiconductor fin, and each channel region having an associated gate structure disposed over the semiconductor fin. The semiconductor structure also includes a plurality of gate edge isolation structures. An adjacent trench contact and gate structure are separated by one gate edge isolation structure of the plurality of gate edge isolation structures. A trench contact local interconnect is disposed above one of the trench contacts and between a pair of the plurality of gate edge isolation structures.

In one embodiment, the semiconductor structure further includes a dielectric cap disposed on the trench contact local interconnect, the dielectric cap disposed between the pair of the plurality of gate edge isolation structures.

In one embodiment, each gate structure includes a high-k gate dielectric layer and a metal gate electrode.

In one embodiment, each of the plurality of gate edge isolation structures is composed of a material such as, but not limited to, silicon oxide, silicon nitride, silicon carbide, or a combination thereof.

In an embodiment, a method of fabricating a semiconductor structure involves forming first and second parallel semiconductor fins above a substrate. The method also involves forming dummy spacers adjacent the sidewalls of each of the first and second semiconductor fins. The dummy spacers of the first semiconductor fin are non-continuous with the dummy spacers of the second semiconductor fin. The method also involves forming an isolation structure between the dummy spacers of the first and second semiconductor fins. The method also involves removing the dummy spacers. The method also involves forming a first replacement gate structure over the first semiconductor fin and a second replacement gate structure over the second semiconductor fin, wherein the first and second gate structures are directly adjacent to, and separated from one another by, the isolation structure.

In one embodiment, the method also involves forming a first pair of trench contacts over the first semiconductor fin and a second pair of trench contacts over the second semiconductor fin. The first and pairs of trench contacts are directly adjacent to, and separated from one another by, the isolation structure.

In one embodiment, the method also involves, subsequent to forming an isolation structure and prior to removing the dummy spacers, recessing the first and second semiconductor fins.

In one embodiment, forming the dummy spacers involves forming and etching a polycrystalline silicon layer.

In one embodiment, forming the isolation structure involves depositing and planarizing a material such as, but not limited to, silicon oxide, silicon nitride, silicon carbide, or a combination thereof.

In one embodiment, forming one or both of the first and second replacement gate structures involves forming a high-k gate dielectric layer and a metal gate electrode.

In one embodiment, the method also involves forming a local interconnect above and electrically coupling the first and second replacement gate structures.

What is claimed is:

1. A semiconductor structure, comprising:
   a semiconductor fin disposed above a substrate and having a length in a first direction;
   a gate structure disposed over the semiconductor fin, the gate structure having a first end opposite a second end in a second direction, orthogonal to the first direction, wherein the gate structure has an uppermost surface; and
   a pair of gate edge isolation structures centered with the semiconductor fin, wherein a first of the pair of gate edge isolation structures is disposed directly adjacent to the first end of the gate structure, and a second of the pair of gate edge isolation structures is disposed directly adjacent to the second end of the gate structure, and wherein the pair of gate edge isolation structures has an uppermost surface co-planar with or above the uppermost surface of the gate structure.

2. The semiconductor structure of claim 1, further comprising:
   source and drain regions disposed in the semiconductor fin, on either side of the gate structure; and
   a first trench contact disposed over the source region and a second trench contact disposed over the drain region, each of the first and second trench contacts having a first end opposite a second end in the second direction, wherein the first of the pair of gate edge isolation structures is disposed directly adjacent to the first end of the first trench contact and to the first end of the second trench contact, and the second of the pair of gate edge isolation structures is disposed directly adjacent to the second end of the first trench contact and to the second end of the second trench contact.

3. The semiconductor structure of claim 1, further comprising:
   a second semiconductor fin disposed above the substrate and having a length in the first direction, the second semiconductor fin spaced apart from the first semiconductor fin;
   a second gate structure disposed over the second semiconductor fin, the second gate structure having a first end opposite a second end in the second direction, wherein the second of the pair of gate edge isolation structures is disposed directly adjacent to the first end of the second gate structure; and
   a third gate edge isolation structure disposed directly adjacent to the second end of the second gate structure, wherein the third gate edge isolation structure and the second of the pair of gate edge isolation structures are centered with the second semiconductor fin.

4. The semiconductor structure of claim 3, further comprising:
   a local interconnect disposed above and electrically coupling the first and second gate structures.

5. The semiconductor structure of claim 4, wherein the local interconnect is self-aligned with the pair of and the third gate edge isolation structures.

6. The semiconductor structure of claim 3, wherein the gate structure is an N-type gate structure, and the second gate structure is a P-type gate structure.

7. The semiconductor structure of claim 1, wherein the gate structure comprises a high-k gate dielectric layer and a metal gate electrode.

8. The semiconductor structure of claim 1, wherein the pair of gate edge isolation structures comprises a material selected from the group consisting of silicon oxide, silicon nitride, silicon carbide, and a combination thereof.

9. A semiconductor structure, comprising:
   a semiconductor fin disposed above a substrate and having a length;
   alternating source/drain and channel regions disposed in the length of the semiconductor fin, each source/drain region having an associated trench contact disposed over the semiconductor fin, and each channel region having an associated gate structure disposed over the semiconductor fin; and a plurality of gate edge isolation structures, wherein an adjacent trench contact and gate structure are separated by one gate edge isolation structure of the plurality of gate edge isolation structures; and a gate local interconnect disposed above one of the gate structures and between a pair of the plurality of gate edge isolation structures.

10. The semiconductor structure of claim 9, further comprising:
a dielectric cap disposed on the gate local interconnect, the dielectric cap disposed between the pair of the plurality of gate edge isolation structures.

11. The semiconductor structure of claim 9, further comprising:
a trench contact local interconnect disposed above one of the trench contacts and between a second pair of the plurality of gate edge isolation structures.

12. The semiconductor structure of claim 11, further comprising:
a dielectric cap disposed on the trench contact local interconnect, the dielectric cap disposed between the second pair of the plurality of gate edge isolation structures.

13. The semiconductor structure of claim 9, wherein each gate structure comprises a high-k gate dielectric layer and a metal gate electrode.

14. The semiconductor structure of claim 9, wherein each of the plurality of gate edge isolation structures comprises a material selected from the group consisting of silicon oxide, silicon nitride, silicon carbide, and a combination thereof.

15. A semiconductor structure, comprising:
a semiconductor fin disposed above a substrate and having a length;
alternating source/drain and channel regions disposed in the length of the semiconductor fin, each source/drain region having an associated trench contact disposed over the semiconductor fin, and each channel region having an associated gate structure disposed over the semiconductor fin; and
a plurality of gate edge isolation structures, wherein an adjacent trench contact and gate structure are separated by one gate edge isolation structure of the plurality of gate edge isolation structures; and
a trench contact local interconnect disposed above one of the trench contacts and between a pair of the plurality of gate edge isolation structures.

16. The semiconductor structure of claim 15, further comprising:
a dielectric cap disposed on the trench contact local interconnect, the dielectric cap disposed between the pair of the plurality of gate edge isolation structures.

17. The semiconductor structure of claim 15, wherein each gate structure comprises a high-k gate dielectric layer and a metal gate electrode.

18. The semiconductor structure of claim 15, wherein each of the plurality of gate edge isolation structures comprises a material selected from the group consisting of silicon oxide, silicon nitride, silicon carbide, and a combination thereof.

19. A method of fabricating a semiconductor structure, the method comprising:
forming first and second parallel semiconductor fins above a substrate;
forming dummy spacers adjacent the sidewalls of each of the first and second semiconductor fins, wherein the dummy spacers of the first semiconductor fin are non-continuous with the dummy spacers of the second semiconductor fin;
forming an isolation structure between the dummy spacers of the first and second semiconductor fins;
removing the dummy spacers; and
forming a first replacement gate structure over the first semiconductor fin and a second replacement gate structure over the second semiconductor fin, wherein the first and second gate structures are directly adjacent to, and separated from one another by, the isolation structure.

20. The method of claim 19, further comprising:
forming a first pair of trench contacts over the first semiconductor fin and a second pair of trench contacts over the second semiconductor fin, wherein the first and pairs of trench contacts are directly adjacent to, and separated from one another by, the isolation structure.

21. The method of claim 19, further comprising:
subsequent to forming an isolation structure and prior to removing the dummy spacers, recessing the first and second semiconductor fins.

22. The method of claim 19, wherein forming the dummy spacers comprises forming and etching a polycrystalline silicon layer.

23. The method of claim 19, wherein forming the isolation structure comprises depositing and planarizing a material selected from the group consisting of silicon oxide, silicon nitride, silicon carbide, and a combination thereof.

24. The method of claim 19, wherein forming one or both of the first and second replacement gate structures comprises forming a high-k gate dielectric layer and a metal gate electrode.

25. The method of claim 19, further comprising:
forming a local interconnect above and electrically coupling the first and second replacement gate structures.

26. An integrated circuit structure, comprising:
a first fin comprising silicon, the first fin having a longest dimension along a first direction;
a second fin comprising silicon, the second fin having a longest dimension along the first direction;
an isolation material between the first fin and the second fin;
a first gate structure over the first fin, the first gate structure having a longest dimension along a second direction, the second direction orthogonal to the first direction, wherein the first gate structure comprises a first gate dielectric layer and a first gate electrode;
a second gate structure over the second fin, the second gate structure having a longest dimension along the second direction, the second gate structure discontinuous with the first gate structure along the second direction, and the second gate structure having an edge facing an edge of the first gate structure along the second direction, wherein the second gate structure comprises a second gate dielectric layer and a second gate electrode;
a gate edge isolation structure between and in contact with the edge of the first gate structure and the edge of the second gate structure along the second direction, the gate edge isolation structure over the isolation material; and
a dielectric material laterally adjacent to the first and second gate structures along the first direction, the dielectric material laterally adjacent to the gate edge isolation structure along the first direction, and the dielectric material discrete from the gate edge isolation structure.

27. The integrated circuit structure of claim 26, wherein the gate edge isolation structure comprises silicon and nitrogen.

28. The integrated circuit structure of claim 26, wherein the dielectric material is in contact with the gate edge isolation structure.

29. The integrated circuit structure of claim 26, wherein the gate edge isolation structure is in contact with a gate dielectric layer of the first gate structure and with a gate dielectric layer of the second gate structure.

30. The integrated circuit structure of claim 29, wherein the gate edge isolation structure is in contact with a metal gate electrode layer of the first gate structure and with a metal gate electrode layer of the second gate structure.

31. The integrated circuit structure of claim 29, wherein the gate dielectric layer of the first gate structure comprises a high-k dielectric material, and wherein the gate dielectric layer of the second gate structure comprises a high-k dielectric material.

32. The integrated circuit structure of claim 26, wherein the gate edge isolation structure has a height greater than a height of the first gate structure and greater than a height of the second gate structure.

33. The integrated circuit structure of claim 32, further comprising:
a local interconnect disposed over a portion of the first gate structure, over a portion of the gate edge isolation structure, and over a portion of the second gate structure.

34. The integrated circuit structure of claim 33, wherein the local interconnect electrically couples the first gate structure to the second gate structure.

35. The integrated circuit structure of claim 33, further comprising:
a gate contact on a portion of the local interconnect over the first gate structure, but not on a portion of the local interconnect over the second gate structure.

36. The semiconductor structure of claim 1, wherein the uppermost surface of the pair of gate edge isolation structures is co-planar with the uppermost surface of the gate structure.

37. The semiconductor structure of claim 1, wherein the uppermost surface of the pair of gate edge isolation structures is above the uppermost surface of the gate structure.

38. A semiconductor structure, comprising:
a semiconductor fin disposed above a substrate and having a length in a first direction;
a gate structure disposed over the semiconductor fin, the gate structure having a first end opposite a second end in a second direction, orthogonal to the first direction, wherein the gate structure comprises a high-k gate dielectric layer and a metal gate electrode; and
a pair of gate edge isolation structures centered with the semiconductor fin, wherein a first of the pair of gate edge isolation structures is disposed directly adjacent to the first end of the gate structure, and a second of the pair of gate edge isolation structures is disposed directly adjacent to the second end of the gate structure.

39. The semiconductor structure of claim 38, further comprising:
source and drain regions disposed in the semiconductor fin, on either side of the gate structure; and
a first trench contact disposed over the source region and a second trench contact disposed over the drain region, each of the first and second trench contacts having a first end opposite a second end in the second direction, wherein the first of the pair of gate edge isolation structures is disposed directly adjacent to the first end of the first trench contact and to the first end of the second trench contact, and the second of the pair of gate edge isolation structures is disposed directly adjacent to the second end of the first trench contact and to the second end of the second trench contact.

40. The semiconductor structure of claim 38, further comprising:
a second semiconductor fin disposed above the substrate and having a length in the first direction, the second semiconductor fin spaced apart from the first semiconductor fin;
a second gate structure disposed over the second semiconductor fin, the second gate structure having a first end opposite a second end in the second direction, wherein the second of the pair of gate edge isolation structures is disposed directly adjacent to the first end of the second gate structure; and
a third gate edge isolation structure disposed directly adjacent to the second end of the second gate structure, wherein the third gate edge isolation structure and the second of the pair of gate edge isolation structures are centered with the second semiconductor fin.

41. The semiconductor structure of claim 40, further comprising:
a local interconnect disposed above and electrically coupling the first and second gate structures.

42. The semiconductor structure of claim 41, wherein the local interconnect is self-aligned with the pair of and the third gate edge isolation structures.

43. The semiconductor structure of claim 40, wherein the gate structure is an N-type gate structure, and the second gate structure is a P-type gate structure.

44. The semiconductor structure of claim 38, wherein the gate structure comprises a high-k gate dielectric layer and a metal gate electrode.

45. The semiconductor structure of claim 38, wherein the pair of gate edge isolation structures comprises a material selected from the group consisting of silicon oxide, silicon nitride, silicon carbide, and a combination thereof.

* * * * *